United States Patent
Hall et al.

(10) Patent No.: US 7,371,691 B2
(45) Date of Patent: May 13, 2008

(54) SILICON RECESS IMPROVEMENT THROUGH IMPROVED POST IMPLANT RESIST REMOVAL AND CLEANS

(75) Inventors: Lindsey H. Hall, Plano, TX (US); Trace Q. Hurd, Plano, TX (US); Deborah J. Riley, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 10/901,827

(22) Filed: Jul. 29, 2004

(65) Prior Publication Data

US 2006/0024972 A1 Feb. 2, 2006

(51) Int. Cl.
*H01L 21/3065* (2006.01)
(52) U.S. Cl. .................................................. 438/725
(58) Field of Classification Search ............. 438/725, 438/738, 745, 751
See application file for complete search history.

(56) References Cited

U.S. PATENT DOCUMENTS

| | | | | |
|---|---|---|---|---|
| 5,766,991 | A * | 6/1998 | Chen ........................... | 438/231 |
| 5,994,181 | A * | 11/1999 | Hsieh et al. ................. | 438/239 |
| 6,207,583 | B1 * | 3/2001 | Dunne et al. ............... | 438/725 |
| 6,218,640 | B1 * | 4/2001 | Selitser .................. | 219/121.52 |
| 6,221,564 | B1 * | 4/2001 | Jeng et al. ................... | 430/319 |
| 6,686,558 | B2 * | 2/2004 | Selitser .................. | 219/121.52 |
| 6,707,079 | B2 * | 3/2004 | Satoh et al. ................. | 257/288 |
| 6,791,138 | B2 * | 9/2004 | Weimer et al. ............. | 257/306 |
| 6,962,853 | B2 * | 11/2005 | Segawa et al. ............. | 438/303 |
| 2001/0008229 | A1 * | 7/2001 | Selitser .................. | 219/121.52 |
| 2001/0041409 | A1 * | 11/2001 | Jeng et al. ................... | 438/303 |
| 2004/0157170 | A1 * | 8/2004 | Waldfried et al. .......... | 430/329 |
| 2004/0157397 | A1 * | 8/2004 | Quek .......................... | 438/305 |
| 2005/0093158 | A1 * | 5/2005 | Liu et al. ..................... | 257/758 |
| 2005/0191584 | A1 * | 9/2005 | Shea et al. .................. | 430/329 |

OTHER PUBLICATIONS

Wolf et al., Silicon Processing fo the VLSI Era, Lattice Press, vol. 1 p. 518, vol. 2 635-637, 1986 and 1990.*

* cited by examiner

*Primary Examiner*—Zandra Smith
*Assistant Examiner*—Seth Barnes
(74) *Attorney, Agent, or Firm*—Frederick J. Telecky, Jr.; Wade J. Brady, III

(57) ABSTRACT

The present invention provides a process of manufacturing a semiconductor device 200 while reducing silicon loss. In one aspect, the process includes removing a photoresist layer 270 from a semiconductor substrate 235 adjacent a gate 240 and cleaning the semiconductor substrate with a wet clean solution. The removing step includes subjecting the photoresist layer 270 to a plasma ash. The plasma ash removes at least a portion of a crust 275 formed on the photoresist layer 270 but leaves a substantial portion of the photoresist layer 270. The photoresist layer 270 is subjected to a wet etch subsequent to the plasma ash that removes a substantial portion of the photoresist layer 270.

14 Claims, 7 Drawing Sheets

SILICON RECESS IMPROVEMENT THROUGH IMPROVED POST IMPLANT RESIST REMOVAL AND CLEANS

TECHNICAL FIELD OF THE INVENTION

The present invention is directed, in general, to a method of fabricating a semiconductor device and, more specifically, to a process for removing a photoresist and cleaning the substrate subsequent to removing the photoresist and one that reduces silicon recess formation adjacent transistor gates.

BACKGROUND OF THE INVENTION

In the manufacture of semiconductor devices, photoresist masks are typically employed to protect areas which are not to be treated in a particular processing step, such as etching or implantation. After the processing step is completed, the photoresist is removed, and the next step in the manufacturing process is performed. This is particularly the case for the formation of lightly doped drain (LDD) regions and source/drain regions adjacent a transistor gate. For a given device, it may be necessary to apply and remove photoresist many times during various implant steps, and it is important that after each implant all of the photoresist is completely removed and the wafer surface is cleaned to avoid contamination and defects.

Currently, photoresist is most commonly stripped or "ashed" in plasma reactors which employ an RF discharge to produce oxygen radicals which combine with the hydrocarbons of the photoresist to produce water and carbon dioxide in gaseous form, which makes for easy disposal. Because of the presence of oxygen in a highly charged environment, these plasma processes are highly oxidizing with respect to the silicon surface. After the ash step is complete, the silicon substrate is cleaned with a wet clean step to remove any remaining particle residues.

The area on the semiconductor surface that is of rising concern is the area adjacent the transistor gates. Typically, the regions adjacent the gates can undergo several ash and clean steps following dopant implantation steps. When silicon is exposed to the oxidizing environment of these conventional ashing processes, a portion of the silicon adjacent the gate, and particularly in the LDD region, is oxidized. The ashing process is conducted for a period of time and at energy levels sufficient to remove the photoresist. It is during this exposure time that the silicon adjacent the gate structures is oxidized. Because of the amount of energy and time associated with such conventional ashing steps and the number of times the ashing steps are conducted, the silicon oxidation can achieve a significant thickness, which consumes a relatively substantial amount of silicon. As the areas adjacent the gates are subjected to clean steps, a portion of the oxidized silicon is removed. After repeating these steps several times, a significant portion of the original silicon substrate is removed to form recesses adjacent the gate. In fact, silicon loss can range from about 5 nm to about 7 nm.

In the past, the lightly doped implant regions were much larger and deeper due to the overall device size, and due to these larger sizes, silicon loss in the LDD regions was not of great concern. However, as devices have shrunk below the submicron range, implants have become much shallower, and in some cases, more lightly doped. As such, any loss of silicon in the LDD regions can lead to dopant loss, Negative Bias Temperature Instability (NBTI) degradation, channel pinch-out, and can generally have a significant negative impact on device performance.

Therefore what is needed in the art is a photoresist removal and clean process that avoids these disadvantages.

SUMMARY OF THE INVENTION

To address the above-discussed deficiencies of the prior art, the present invention provides a process of manufacturing a semiconductor device while reducing silicon loss. In one embodiment, the process includes removing a photoresist layer from a semiconductor substrate adjacent a gate and cleaning the semiconductor substrate with a wet clean solution. In one aspect of this embodiment, the removing includes subjecting the photoresist layer to a plasma ash. The plasma ash removes at least a portion of a crust formed on the photoresist layer but leaves a substantial portion of the photoresist layer. The photoresist layer is subjected to a wet etch subsequent to the plasma ash that removes a substantial portion of the photoresist layer.

In another embodiment, there is provided another process of manufacturing a semiconductor device while reducing silicon loss. In this particular embodiment the photoresist layer resist is removed from a semiconductor substrate by subjecting the photoresist layer to a wet etch wherein the wet etch removes at least a substantial portion of the photoresist layer. The photoresist layer is adjacent a gate and the semiconductor substrate includes a doped region adjacent the gate having a dopant concentration of less than 1E15 atom/cm$^3$. The process further includes cleaning the semiconductor substrate with a wet clean solution subsequent to removing a substantial portion of the photoresist.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

As discussed above, silicon recesses can form adjacent the gate structure in LDD regions as the result of the harsh oxidizing environment associated with conventional photoresist removal processes and subsequent cleans. The silicon loss in the LDD regions can have detrimental effects on the transistors performance due to pinch out in the channel region, NBTI degradation and dopant loss in the LDD region. The present invention recognizes the advantages associated with modifying conventional photoresist removal regimens by limiting the amount of exposure of the silicon substrate to the oxidizing environments associated with conventional photoresist plasma etches and subsequent clean steps.

Figure 1:
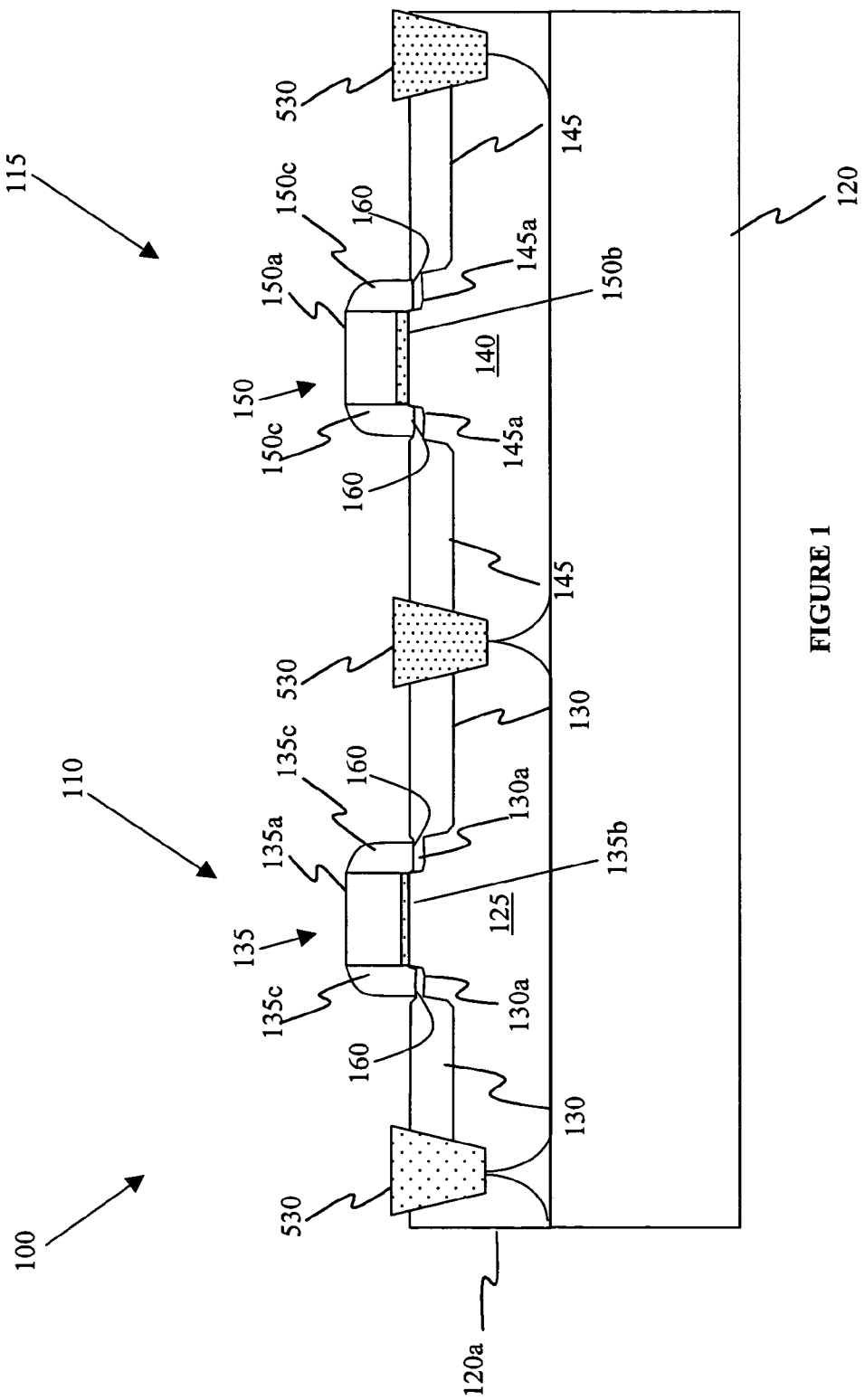
FIG. 1 is a sectional view of a semiconductor device 100 manufactured in accordance with one embodiment of the present invention.

Turning initially to FIG. 1, there is illustrated a sectional view of a semiconductor device 100 manufactured in accordance with one embodiment of the present invention. The semiconductor device 100, as shown is a complementary CMOS device having both PMOS and NMOS devices, 110,115, respectively. The PMOS and NMOS devices 110, 115 are formed over a base semiconductor substrate 120, such as a silicon substrate, and preferably within a device substrate 120*a*. The semiconductor substrate 120 may be the substrate itself or may be an epitaxially grown epi layer located over the semiconductor substrate 120. The PMOS device 110 includes an N-type doped well 125 formed in the semiconductor substrate 120 in which P-type source/drains 130 are formed. In the illustrated embodiment, the source/drains 130 include LDD regions 130*a*. A transistor gate structure 135 is located adjacent the source/drains 130 and includes a conventionally formed gate 135*a* located over a gate dielectric 135*b* and spacers 135*c*.

Similarly, the NMOS device 115 includes a P-type doped well 140 formed in the semiconductor substrate 120 in which N-type source/drains 145 are formed. In the illustrated embodiment, the source/drains 145 include LDD regions 145*a*. A transistor gate structure 150 is located adjacent the source/drains 145 and includes a conventionally formed gate 150*a* located over a gate dielectric 150*b* and spacers 150*c*. Conventionally formed trench isolation structures 530 electrically isolate the PMOS device 110 and the NMOS device 115 from each other.

Attention is now drawn to the LDD regions 130*a* and 145*a* of each device. As seen in the embodiment illustrated in FIG. 1, the surface of the semiconductor substrate 120*a* includes silicon recess areas 160 located adjacent each of the gates 135*a* and 150*a* that may be present in some embodiments. However, while the silicon recesses are still present, they are substantially reduced in depth as a result of using the photoresist removal and clean processes discussed below. Due to the less oxidizing processes presented by the present invention, there is far less silicon loss that occurs with conventional photoresist removal and clean processes such that the detrimental effects of the silicon recess do not significantly impact device performance. In an advantageous embodiment, the depth of the silicon recess areas 160 is not greater than about 2 nm. It should be noted, however, that in advantageous embodiments, the silicon recess may not present at all.

Figure 2:
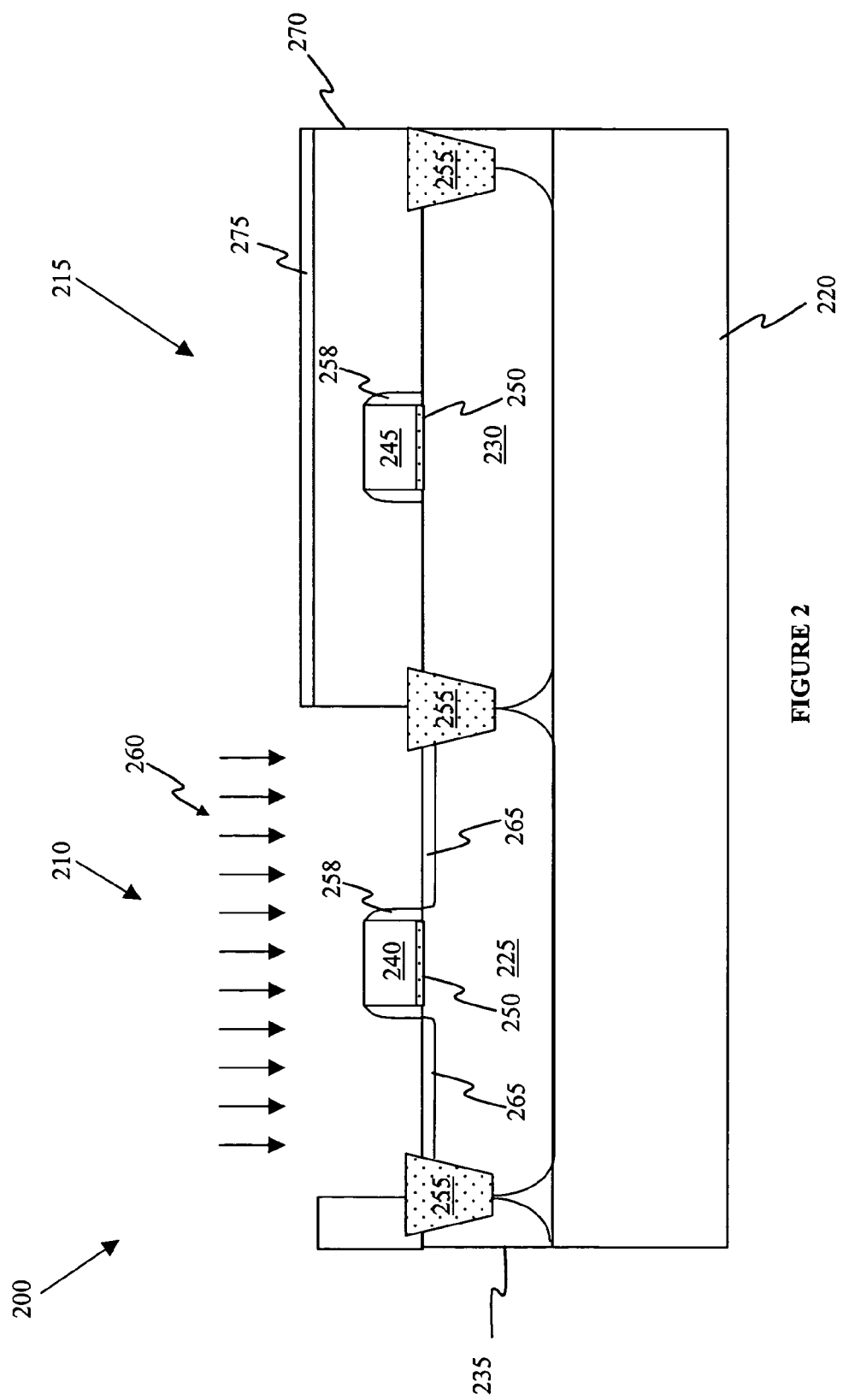
FIG. 2 is a sectional view of a semiconductor device similar to the one shown in FIG. 1 but at an earlier stage of manufacture.

Turning now to FIG. 2, there is illustrated a sectional view of a semiconductor device 200, similar to the one shown in FIG. 1 but at an earlier stage of manufacture. In this particular embodiment, the semiconductor device includes a PMOS device 210 and an NMOS device 215 that are located over a semiconductor wafer 220 and that each have respectively doped wells 225, 230 formed in a silicon semiconductor substrate 235. The PMOS device 210 and NMOS device 215 each include a gate 240, 245 located over a gate dielectric 250 and are isolated from each other by isolation structures 255. Located on the sides of each gate 240, 245 are off-set spacers 258 that are used for the purpose of off-setting the LDD during implant. Compared to later formed spacers, these spacers are relatively thin having a thickness ranging from about 5 nm to about 14 nm. All of the components just discussed are formed using conventional processes.

FIG. 2 also shows the PMOS device 210 undergoing a conventional LDD implant 260, designated by arrows. Steps that are not shown for brevity include the deposition of the photoresist layer 270 and its exposure. The exposed photoresist layer 270 has been removed using conventional plasma ash processes. The dopant is a P-type dopant, but the doping concentration of the LDD implant 260 varies depending on design specifications and application, but typically, the LDD implant 260 is a low energy implant. For example, the implant may result in a LDD region 265 having a doping concentration of less than 1E14 atoms/cm3 and ranging up to a doping concentration of 2.5E15 atoms/cm3. It should be understood that these doping concentrations are exemplary only and the concentrations may vary greatly, depending on design specifications. Also seen in FIG. 2 is a photoresist layer 270 that protects the NMOS device 215 from the LDD implant. Due to the implant process, the outer surface of the photoresist layer 270 develops an outer crust 275 that is resistant to conventional wet etches.

Following the LDD implant, the photoresist masking the NMOS device 215 is removed. In the past, manufacturers used an ashing process that subjected the unprotected silicon substrate of the PMOS device 210 and the NMOS 215 to prolonged exposure to a highly oxidizing, photoresist plasma etching chemistry. For example, in some regimes, the ashing process could involve as many as 6 steps where the silicon substrate was exposed to the ashing plasma for as much as 6 minutes with the time per step ranging from about 90 second to about 240 seconds. This prolonged exposure would oxidize the unprotected silicon surface each time that a plasma ashing step was conducted. However, in the present invention it has been found that the ashing time can be substantially reduced from the conventional process and still get good removal of the photoresist but with far less oxidation occurring during the process.

Figure 3:
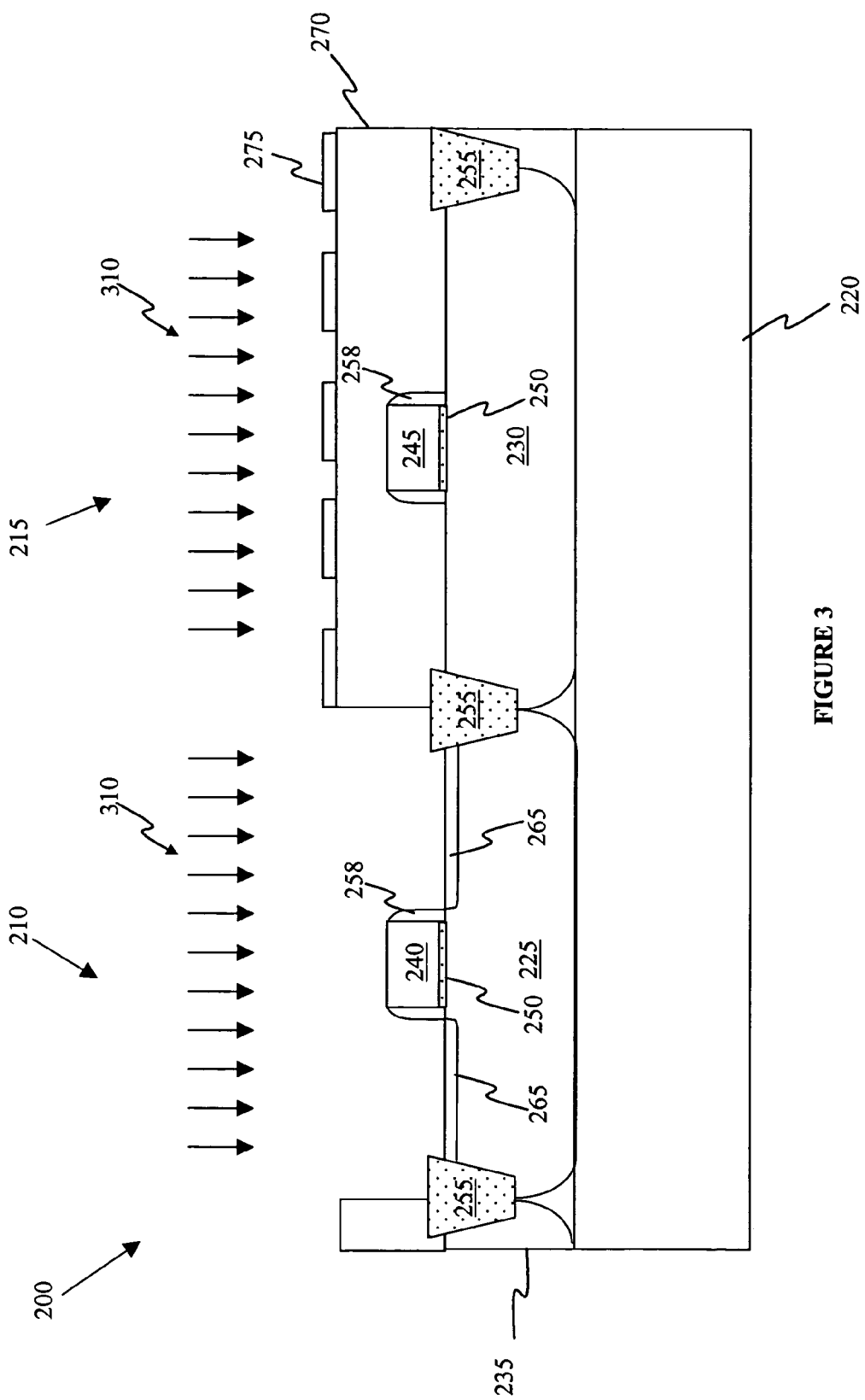
FIG. 3 is a sectional view of the semiconductor device of FIG. 2 after completion of the LDD implant.

Turning now to FIG. 3, there is shown a sectional view of the semiconductor device 200 after completion of the LDD implant 260. In one embodiment, the process includes removing the photoresist layer 270 by subjecting the photoresist layer 270 to a plasma ash 310, designated by the arrows. However, unlike conventional plasma ashing processing, in this particular embodiment, the plasma ash 310 is conducted for only a time sufficient to either remove at least a portion of the crust 275 formed on the photoresist layer 270 or to sufficiently break up the crust 275. In either case, however, a substantial portion of the photoresist layer 270 remains intact. For example, at least about 50% to about 90% or more of the photoresist may remain following the plasma ash 310. In the exemplary embodiment shown in FIG. 3, the crust 275 is shown broken up. Whether the crust 275 is removed completely or simply broken up, the end result is that the underlying photoresist layer 270 is exposed such that a wet chemical etch, and one that is far less oxidizing than the plasma ash, can be used to remove the bulk portion of the photoresist layer 270.

In one particular embodiment, the photoresist layer 270 is subjected to a plasma containing oxygen. Nitrogen may also be present, but preferably it is not. Hydrogen may also be used in place of oxygen as the primary etchant gas. The plasma parameters used to generate the plasma may vary, but in one embodiment, the power about 1500 watts and plasma is conducted at a pressure of about 1.5 Torr, and in an advantageous embodiment, the flow rate of the oxygen is about 3000 sccms. The temperature of the plasma ash may also vary, but it is preferable that the temperature range from about 130° C. to about 150° C., and with a more advantageous temperature being about 130° C.

The period of time during which the plasma ash 310 is conducted is much shorter than those found in conventional processes. For example, as previously mentioned some conventional processes subject the photoresist layer to plasma ashing conditions for as much as 6 minutes over the course of 6 different steps. However, in an advantageous embodiment of the present invention, the plasma ash 310 is of short duration with the photoresist layer 270 being subjected to the plasma ash 310 for a total period of time not longer than about 90 seconds, and more preferably the total period of time is not longer than about 50 seconds.

The purpose of this short period of time is meant to be sufficient to simply break up the crust 275 or remove enough of it to expose the photoresist layer 270 to a subsequent wet chemical etch and not to remove the photoresist layer 270 completely. It should be understood, however, that the present invention also contemplates that some of the underlying photoresist layer 270 may also be removed during the plasma ash 310, but as discussed above, a substantial portion of it would remain due to the short period of time that the photoresist layer 270 would be subjected to the plasma ash 310. Further, the short duration of the plasma ash also limits exposure of the unprotected silicon surface in the PMOS device 210 to oxidizing conditions, which limits the amount of oxide formed during that period of time, and in turn, substantially reduces silicon recess formation adjacent the gate 240. For example, it has been found that by using the short plasma ash 310, the oxide growth adjacent the gate 240 during the plasma ash 310 was less than about 1 nm and in a more preferred embodiment was about 0.25 nm.

Figure 4:
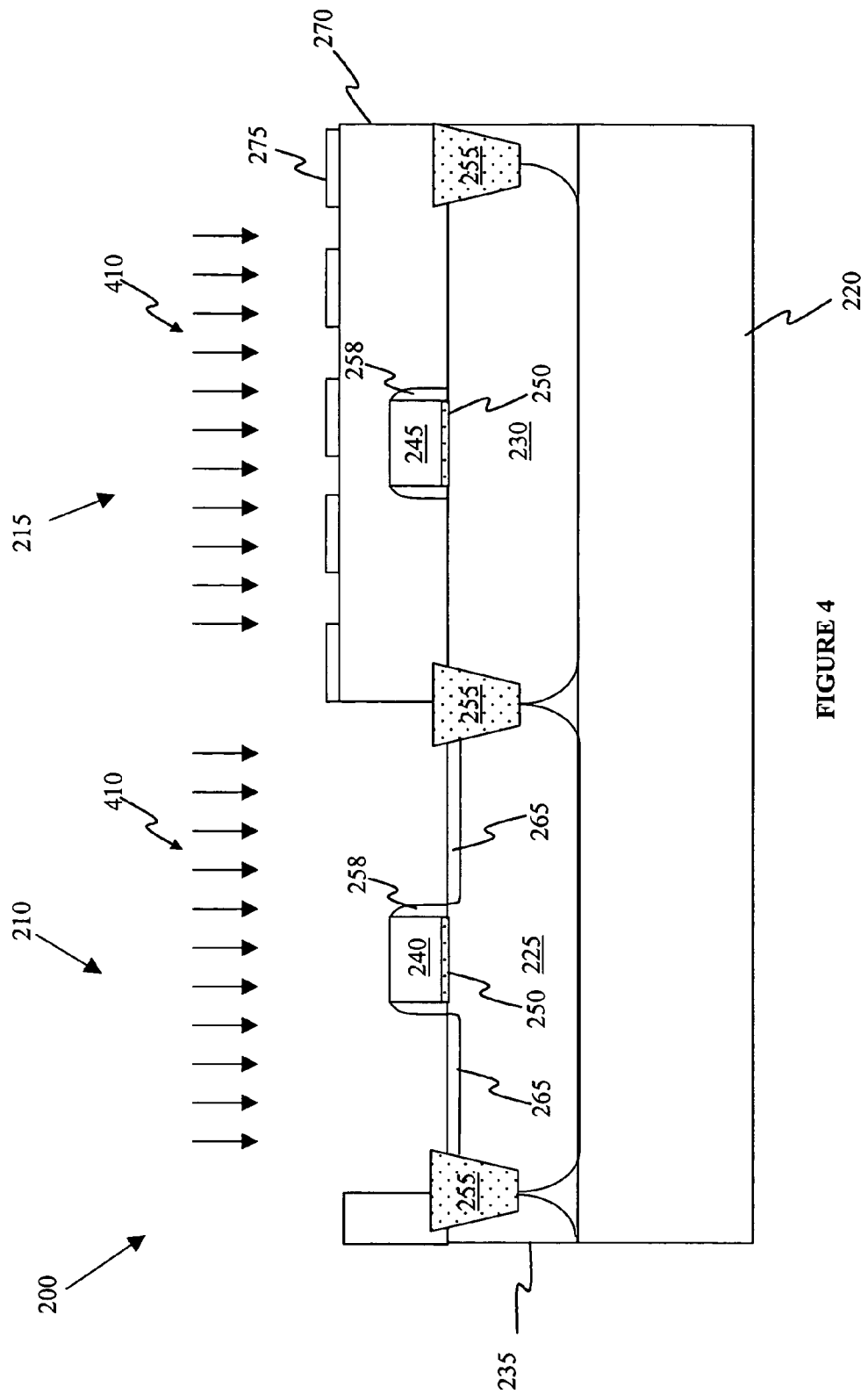
FIG. 4 is a sectional view of the semiconductor device of FIG. 3 subsequent to the plasma ash and schematically shown being subjected to a wet etch.

Turning now to FIG. 4, a sectional view of the semiconductor device 200 of FIG. 3 is shown subsequent to the plasma ash and schematically shown being subjected to a wet etch 410, designated by the arrows, which is intended to remove the bulk portion of the photoresist layer 270. In one embodiment, the wet etch includes a mixture of sulfuric acid and hydrogen peroxide. Preferably, a volumetric ratio of concentrated sulfuric acid to concentrated hydrogen peroxide is about 6:1, wherein the concentrated hydrogen peroxide is about 70% water by volume. Other wet etches, such as organic photoresist strippers, nitric acid mixtures, or ozone/sulfuric acid mixtures, may be used in place of those mentioned above. The photoresist layer 270 is preferably subjected to the wet etch 410 in a bath ranging from about 1 minute to about 7 minutes and at a temperature ranging from about 60° C. to about 130° C.

Figure 5:
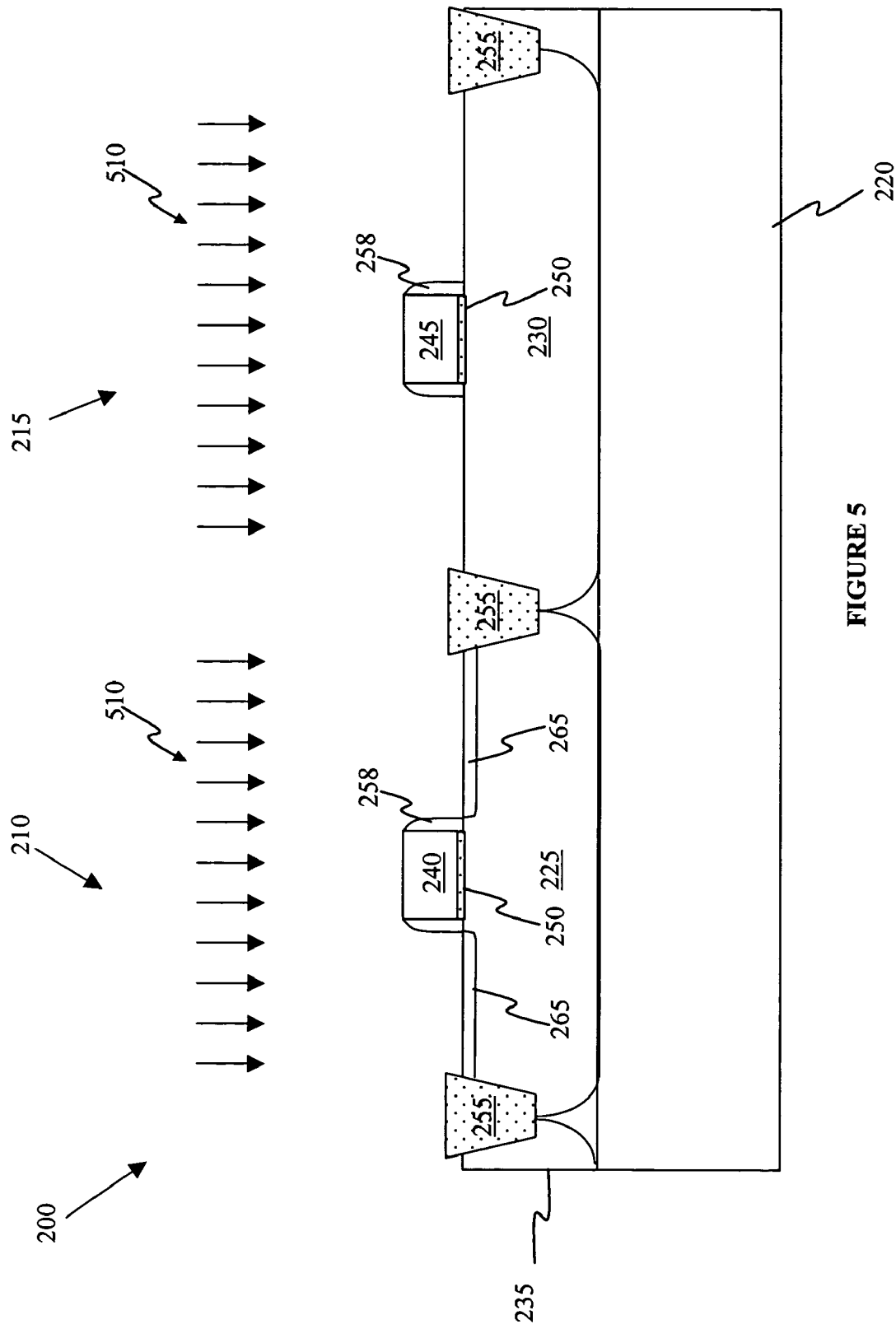
FIG. 5 is a section view of the semiconductor device of FIG. 4 following the substantial removal of the photoresist layer by using the wet etch.

Turning now to FIG. 5, illustrated is a section view of the semiconductor device 200 of FIG. 4, following the substantial removal of the photoresist layer 270 by using the wet etch 410. At this particular point of manufacture, the semiconductor device 200 is subjected to a wet clean solution 510, designated by the arrows, to remove any trace amounts of the photoresist layer that might remain and any other contaminating particles. In one embodiment, the wet clean solution includes a mixture of ammonium hydroxide, hydrogen peroxide and water. In one aspect of this embodiment, a volumetric ratio of ammonium hydroxide to hydrogen peroxide to water is about 1:1:10. The semiconductor device 200 is preferably subjected to the wet clean solution 510 in a bath for about 7 minutes and at a temperature ranging from about 25° C. to about 80° C.

Figure 6:
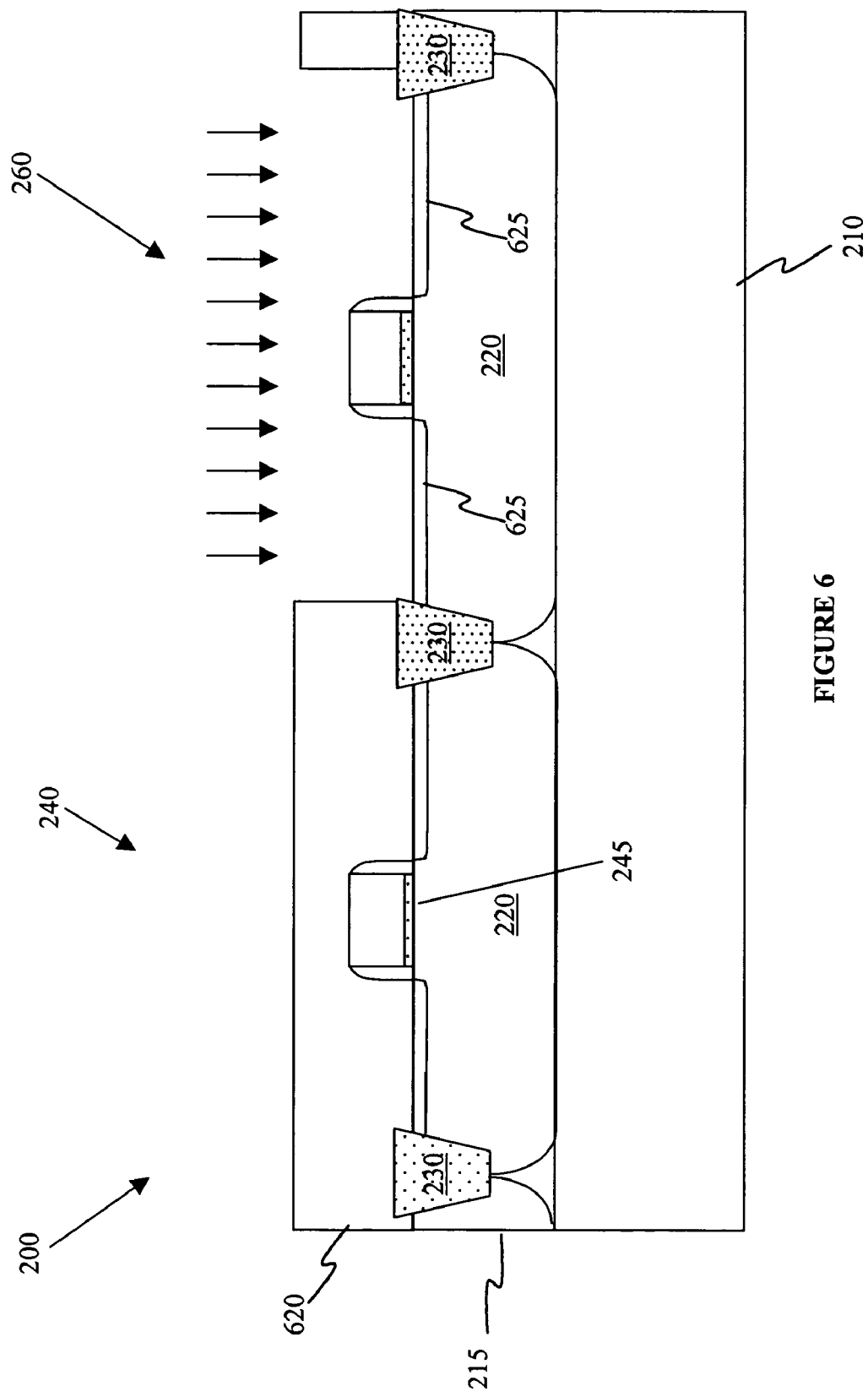
FIG. 6 is a sectional view of the semiconductor device discussed in FIG. 5, following the clean step and deposition, exposure and removal of a photoresist layer to expose the NMOS device to an implant.

Turning now to FIG. 6, which is a sectional view of the semiconductor device 200 discussed in FIG. 5, following the clean step as described above, a photoresist layer 620 is applied, exposed and removed as mentioned above with respect to FIG. 2 to expose the NMOS device 260 to an implant. LDD regions 625 are implanted in the NMOS device 260, and the entire photoresist removal and clean process as described above is repeated, as previously discussed. This is shown to illustrate the point that during the formation of LDD regions and source/drain region, the semiconductor device 200 can undergo numerous photoresist removal and clean steps. Thus, it is important that oxidation of the silicon be limited as much as possible by using the processes discussed herein.

Referring again generally to FIGS. 1-5, in another embodiment of the present invention, the photoresist is removed by simply using the wet etch and cleans discussed above with respect to other embodiments. This embodiment is applicable where the LDD regions 130a and 145a of the PMOS and NMOS devices 110, 115, respectively, have a dopant concentration of less than about 4E15 atoms/cm3 and preferably a dopant concentration of less than about 2E15 atoms/cm3, and more preferably a concentration of less than about 1E14 atoms/cm3. The photoresist layer 270 is removed by subjecting it to a wet etch 410, wherein the wet etch 410 removes at least a substantial portion (e.g., all but a trace amount) of the photoresist layer 270. In this particular embodiment, a plasma ash is not used to remove the photoresist. Following the removal of the photoresist layer 270, the semiconductor device 200 is then cleaned with a wet clean solution 510 to remove any remaining portions of the photoresist layer 270 and other contaminating particles.

The wet etch 410 may be the same as those discussed above regarding other embodiments. That is, the wet etch may be a mixture of sulfuric acid and hydrogen peroxide. In an advantageous embodiment, a volumetric ratio of concentrated sulfuric acid to concentrated hydrogen peroxide is about 6:1, wherein the concentrated hydrogen peroxide is about 70% water by volume. The wet clean solution 510 may also be the same as those discussed above regarding other embodiments. For example, the wet clean solution 510 may be a mixture of ammonium hydroxide, hydrogen peroxide and water. Preferably, a volumetric ratio of ammonium hydroxide to hydrogen peroxide to water is about 1:1:10. To remove the photoresist layer 270 and conduct the subsequent clean, the semiconductor device 200 is advantageously exposed to the wet etch 410 ranging from about 1 minute to about 7 minutes and at a temperature ranging from about 60° C. to about 130° C. Likewise, the semiconductor device 200 is advantageously exposed to the wet clean solution 510 for about 7 minutes and at a temperature ranging from about 25° C. to about 80° C.

Figure 7:
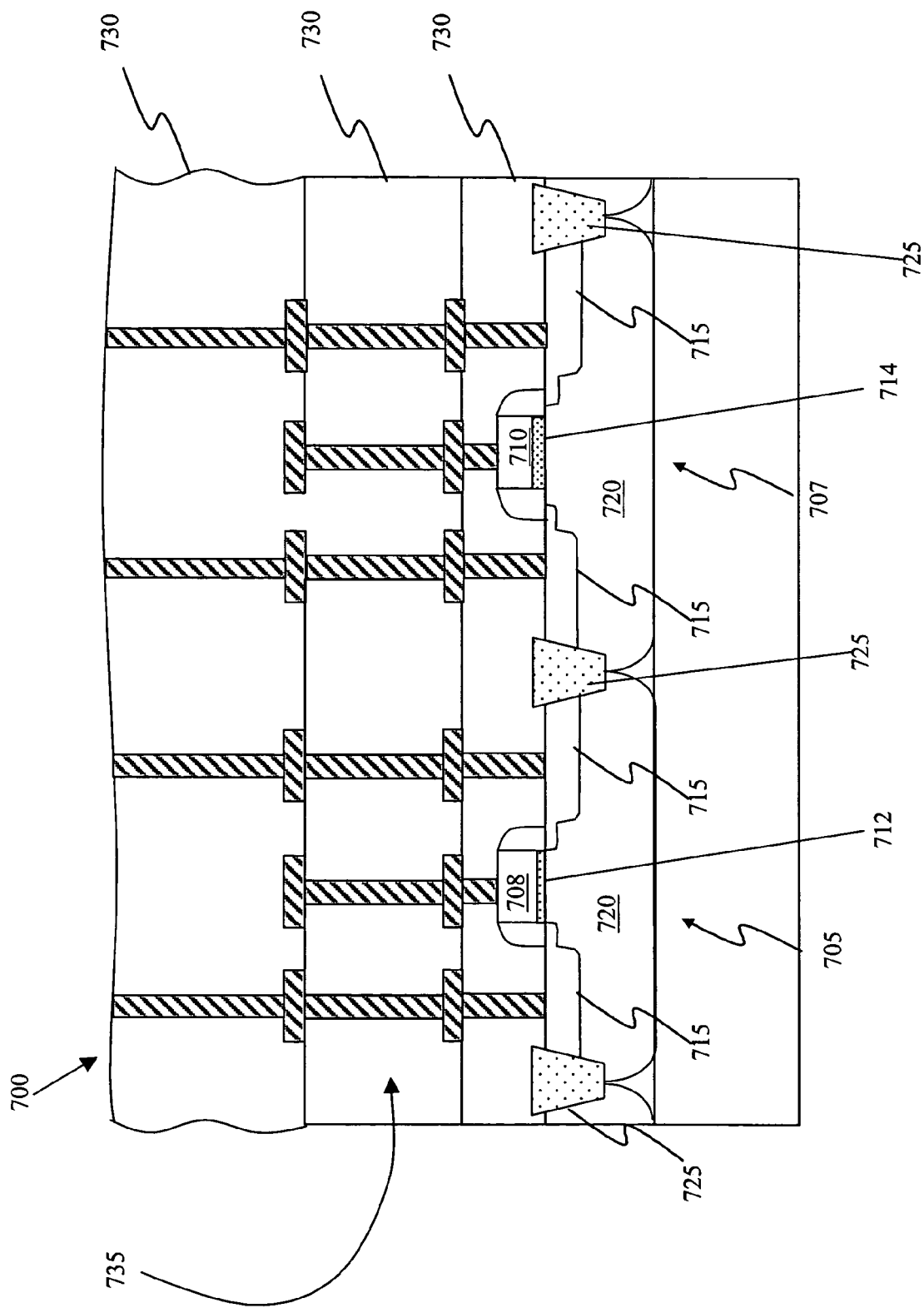
FIG. 7 illustrates a sectional view of an integrated circuit device fabricated in accordance with the present invention.

As seen from the foregoing, the above-described process can be used to manufacture an integrated circuit that has far less silicon loss than that afforded by conventional plasma ash photoresist removal processes. Moreover, the present invention can be used at any stage of manufacture in which it is desirable to lessen silicon consumption. FIG. 7 represents an example of one such integrated circuit device. The integrated circuit 700 includes transistors 705, 707 that include gates 708, 710 and source/drains 715 formed in wells 720, which can be doped to form a complementary metal oxide semiconductor design layout. Isolation structures 725 separate and electrically isolate the transistors 705 from each other. The process discussed above and covered by the present invention may be used to form the transistors 705. Interlevel dielectric layers 730 are located over the transistors 705, and interconnects 735 are formed therein to interconnect the various transistors 705 to form an operative integrated circuit. Given the teachings of present application, one who is skilled in the art would know how to form the operative integrated circuit as shown in FIG. 7.

Although the present invention has been described in detail, one of ordinary skill in the art should understand that they can make various changes, substitutions and alterations herein without departing from the scope of the invention.

What is claimed is:

1. A process of manufacturing a semiconductor device, comprising:
    removing a photoresist layer from a silicon semiconductor substrate, the silicon substrate having lightly doped drain regions adjacent a transistor gate structure, while reducing silicon loss in the lightly doped drain regions of the substrate, including:
        subjecting the photoresist layer to a plasma ash including subjecting the photoresist layer to a plasma for a period not longer than about 90 seconds, the plasma ash removing at least a portion of a crust formed on the photoresist layer but leaving a substantial portion of the photoresist layer;
        subjecting the photoresist layer to a wet etch subsequent to the plasma ash, the wet etch removing the substantial portion of the photoresist layer and substantially reducing formation of silicon recesses in the lightly doped drain region; and
    cleaning the semiconductor substrate with a wet clean solution.

2. The process as recited in claim 1 wherein subjecting the photoresist layer to a plasma ash includes subjecting the photoresist layer to a plasma containing oxygen at a power of about 1500 watts and at a pressure of about 1.5 Torr.

3. The process as recited in claim 2 wherein a flow rate of the oxygen is about 3000 sccms at a temperature of about 130° C.

4. The process as recited in claim 1 wherein during subjecting the photoresist layer to a plasma ash, oxide growth in the lightly doped drain region of the silicon substrate adjacent the gate is less than about 1 nm.

5. The process as recited in claim 1 wherein subjecting the photoresist layer to a plasma ash includes subjecting the photoresist layer to a plasma containing oxygen having a flow rate of about 3000 sccms, at a power of about 1500 watts, a pressure of about 1.5 Torr, and a temperature of about 150° C.

6. The process as recited in claim 1 wherein the wet etch includes a mixture of sulfuric acid and hydrogen peroxide and the wet clean solution includes a mixture ammonium hydroxide, hydrogen peroxide and water.

7. The process as recited in claim 6 wherein a volumetric ratio of concentrated sulfuric acid to concentrated hydrogen peroxide is about 6:1, and wherein the concentrated hydrogen peroxide is about 70% water by volume and wherein a volumetric ratio of ammonium hydroxide to hydrogen peroxide to water is about 1:1:10.

8. The process as recited in claim 6 wherein subjecting the photoresist layer to a the wet etch includes placing the semiconductor substrate into the wet etch ranging from about 1 minute to about 7 minutes and at a temperature ranging from about 60° C. to about 130° C. and cleaning includes placing the semiconductor substrate into the wet clean solution for about 7 minutes and at a temperature ranging from about 25° C. to about 80° C.

9. The process as recited in claim 1 wherein cleaning includes removing a remaining portion of the photoresist and removing particle residue from the substrate.

10. The process as recited in claim 1 wherein leaving a substantial portion of the photoresist layer includes leaving at least about 50% of the photoresist layer.

11. The process as recited in claim 10 wherein leaving includes leaving about 90% of the photoresist layer.

12. The process as recited in claim 1 wherein during subjecting the photoresist layer to a plasma ash, oxide growth comprises about 0.25 nm.

13. The process as recited in claim 1 wherein silicon loss in the lightly doped drain region is less than 2 nm.

14. The process as recited in claim 1 wherein silicon loss in the lightly doped drain region is eliminated.

* * * * *